350-96.15 SR
XR 3,883,772

United States Patent [19]
Wako et al.
[11] 3,883,772
[45] May 13, 1975

[54] ELECTRIC LIGHT-EMITTING APPARATUS

[75] Inventors: Kazuo Wako, Joyo; Kenichi Konishi, Kyoto, both of Japan

[73] Assignee: Matsushita Electronics Corporation, Osaka, Japan

[22] Filed: Apr. 26, 1973

[21] Appl. No.: 354,885

[30] Foreign Application Priority Data

May 2, 1972 Japan .............................. 47-44139

[52] U.S. Cl. ................ 313/499; 313/500; 313/510; 313/512; 313/513; 357/17; 357/45

[51] Int. Cl. .......................... H01j 1/62; H01j 63/04

[58] Field of Search ............. 240/1 EL; 250/217 SS; 313/108 R, 108 B, 108 D, 109.5, 114; 317/234 E, 234 G, 234 H, 235 N, 235 AJ

[56] References Cited

UNITED STATES PATENTS

| | | | |
|---|---|---|---|
| 3,290,539 | 12/1966 | Lamorte | 313/108 X |
| 3,555,335 | 1/1971 | Johnson | 313/109.5 X |

OTHER PUBLICATIONS

"Visible Light-Emitting Diode," W. Jacobus, et al., IBM Technical Disclosure Bulletin, Vol. 10, No. 8, Jan. 1968, p. 1120.

"High-Efficiency Electroluminescent Diodes," B. R. Shah, IBM Technical Disclosure Bulletin, Vol. 9, No. 7, Dec. 1966, pp. 947, 948.

*Primary Examiner*—R. V. Rolinec
*Assistant Examiner*—E. R. LaRoche
*Attorney, Agent, or Firm*—Wenderoth, Lind & Ponack

[57] ABSTRACT

This invention relates to an electric light-emitting apparatus, wherein electric light-emitting diodes 4 are contained in light-conducting wafers 5 of transparent resin embedded in recesses 3, which are formed on an electrically conductive substrate 2, respectively, and each wafer 5 has an oblique diffused-reflection plane 6 for reflecting the light conducted from the light-emitting diodes 4.

7 Claims, 3 Drawing Figures

3883772
OR IN 313/499

PATENTED MAY 1 3 1975 3,883,772

ELECTRIC LIGHT-EMITTING APPARATUS

BACKGROUND OF THE INVENTION

Hitherto, the prior art has used electric light-emitting apparatus having several electric light-emitting diodes embedded in or faced to respective light-conducting transparent resin wafers, whose edges are so arranged in alignment to indicate a letter or a mark when lit. One example of such apparatus was shown, for instance, in the specification of the U.S. Pat. No. 3,555,355. In such prior art, since the edges of the resin wafers were to be seen by the observer, the transparent resin wafer could not be arranged flatly on a supporting board, and moreover, the wire connection to the electrodes of the electric light-emitting diodes was very complicated. Furthermore, there was a possibility that the light was liable to leak into adjoining resin wafers, distorting the intended output indication.

SUMMARY OF THE INVENTION

This invention eliminate the above-mentioned shortcomings of the conventional apparatus.

Accordingly, the present invention is intended to provide a compact electric light-emitting apparatus which is capable of clear indication and is constructed as flat as a printed circuit board. Also, this invention enables easy and precise mass-production of the electric light-emitting apparatus.

DETAILED DESCRIPTION OF THE INVENTION

Figure 1:
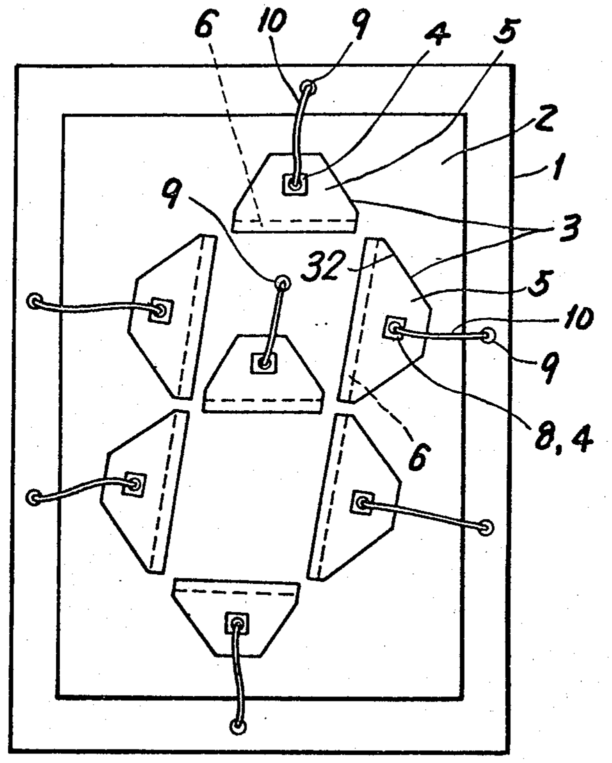
FIG. 1 is a plan view of the apparatus of the present invention.

In FIG. 1, an electrically conductive substrate, for example, an aluminum substrate 2, is positioned on substrate 1 of an insulation board, by, for instance, bonding. On the face of aluminum substrate 2 several recesses 3 are formed in a specified pattern by, for instance, pressing. Each recess 3 has a smooth flat floor or bottom 31 which is surrounded by smooth vertical side walls 32 and an oblique diffused-reflection plane 6 having a rough surface. In one example the aluminum substrate 2 is about 0.5 mm thick and each recess 3 is about 0.2 mm deep. In each recess, each one electric light-emitting diode 4 is located. The diode 4 maybe constructed of for instance, gallium phosphide (GaP) or galliumarsenidephosphide (GaAsP) semiconductor with light-emitting P-N junction 11, and may have dimensions of 0.4 mm by 0.4 mm (broad) by 0.2 mm (deep). The diode is bonded on the flat floor 31 with its lower electrode bonded to a layer 7 of known electrically conductive bond. Also, a wafer 5, tightly contacting the inner faces of the recess 3 and made of light conductive transparent resin, is embedded in the recess 3 by pouring melt resin or unhardened resin in the recess 3, so that the transparent resin wafer 5 surrounds the light-emitting diode 4.

Thus, the wafer 5 of transparent resin containing the light-emitting diode 4 forms a light guide, wherein the upper surface and floor face together form parallel surfaces for conducting the light by the "total reflection phenomenon" the smooth vertical faces of the wafer 5 which are in contact with the vertical walls 32 of the metal constitute reflecting mirrors to conduct the light towards the oblique diffused-reflection plane 6.

Said diffused-reflection plane 6 is roughened either by chemical etching or by sand-blasting, and forms an obtuse angle $\alpha$ against the flat floor 31. An angle $\alpha$of between 135° and 145° has experimentally been found best for clear indication. The diffused-reflection plane 6 is formed, for example, to be 4 mm to 10 mm long by 2 mm widebelt.

Fine connecting wires of, for instance, aluminum or gold connect respective upper electrodes 8 of the light-emitting diodes 4 to the connecting tabs 9 on the insulating substrate 1.

The example shown in FIG. 1 is a seven-element apparatus for indicating numerals 0, 1, 2, 8, 9 for use in a desk-top electronic calculator, for example, in a modified embodiment, the aluminum substrate 2 with the recesses 3 bonded on the insulating board 1 can be replaced by an insulating board with recesses of the similar shapes, a specified part of which board is coated with vapor-deposited aluminum layer.

In other modified embodiments, the recesses may be of other patterns than the abovementioned seven-element numeral indicating pattern, so as to indicate other kind of letter or marks.

Figure 2:
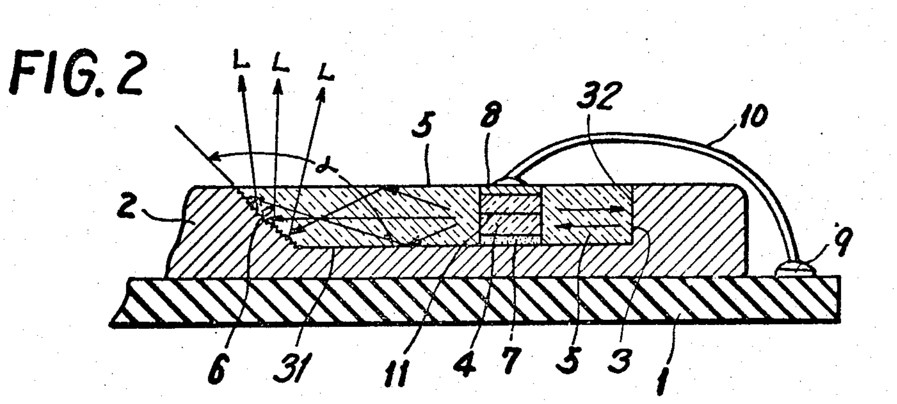
FIG. 2 is an enlarged sectional view of a part of the apparatus of FIG. 1.

Since the electric light-emitting apparatus of the present invention is constituted as abovementioned, when selected light-emitting diodes 4 are lit, the light emitted from the P-N junctions 11 of the light-emitting diodes 4 is conducted by reflection at the respective vertical walls 3 and at both top and floor faces of the respective transparent resin wafers 5 to the diffused-reflection planes 6 and are reflected as shown by arrows L of FIG. 2, allowing the light to be observed, whereby an illuminated letter or mark is displayed. Thus, the light emitted from very small light-emitting diodes 4 illuminate the light-emitting planes 6 of desired lengths and widths, enabling clear indication of the letter or the mark. Since the lights from the light-emitting diode 4 are conducted through the thin transparent resin wafer 5 by the "total reflection phenomenon," the light does not leak outside except from the diffused reflection plane 6, enabling attainment of efficient light conduction and clear indication.

Since the transparent resin wafers 5 containing the light-emitting diode 4 are laid flatly on the electrically conductive substrate, the apparatus has very a simple construction, thereby ensuring that it is shock-proof, thin and may readily be noticed by automated mass-production.

Furthermore, since each lower electrode of the light-emitting diode 4, is directly connected to the conductive substrate 2, it is only the upper electrode that must be wired and connected to the connecting tabs 9 on the insuating substrate 1. Thus wiring of the apparatus is quite simple.

Figure 3:
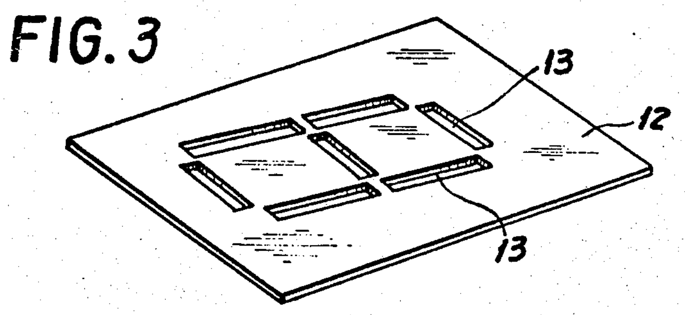
FIG. 3 is a perspective view of a mask for use for further clarification of the indication of the apparatus.

FIG. 3 shows a mask 12 for use for clearer indication. The mask 12 is an opaque light-shielding resin plate having seven slits 13 arranged in a pattern identical to the arrangement of the diffused reflection planes 6 on the substrate 1. The mask 12 is placed on the top of the abovementioned apparatus in such a manner that the diffused reflection planes 6 can be seen through the slits 13.

By covering the unnecessary parts, for instance, connecting wires, connecting tabs or relevant printed circuits, with the mask 12, unnecessary reflections from these parts are eliminated, and therefore, a clearer indication is obtained.

What is claimed is:

1. A light-emitting apparatus, comprising:

an electrically conductive substrate having a predetermined number of recesses, each recess having a flat bottom, smooth vertical side walls and an oblique side wall having a rough surface for diffused reflection, said oblique side wall defining an obtuse angle with the flat bottom;

a light-emitting diode secured on the bottom of each of said recesses, one electrode thereof being electrically connected to said bottom;

a transparent light-conductive resin wafer tightly embedded in each of said recesses and surrounding said light-emitting diode, an oblique light reflecting roughened face being defined by said oblique side wall, light rays emitted from the light-emitting diode being thereby reflected out from the wafer;

an insulating substrate supporting said conductive substrate; and, a wire connecting the other electrode of each of said light-emitting diodes to a connecting tab on said insulating substrate.

2. The apparatus of claim 1, wherein the oblique side face for diffused reflection is shaped as a belt.

3. The apparatus of claim 1, wherein the conductive substrate is made of a metal plate, in which said recesses are pressed.

4. The apparatus of claim 1, wherein the P-N junction of the light-emitting diode is arranged substantially parallel to the flat bottom of the recess.

5. The apparatus of claim 1, wherein said obtuse angle is between 135° and 145°.

6. The apparatus of claim 1, wherein the oblique side wall for diffused-reflection has larger area than the light-emitting area of the light-emitting diode.

7. The apparatus of claim 1, further comprising a light-shielding mask covering the upper face of said apparatus and having slits arranged to pass the light reflected from the oblique side wall for diffused-reflection.

* * * * *